United States Patent [19]

Nishijima

[11] Patent Number: 5,122,760

[45] Date of Patent: Jun. 16, 1992

[54] DETECTOR FOR AUTOMATIC GAIN CONTROL AMPLIFIER CIRCUIT

[75] Inventor: Kazunori Nishijima, Tokyo, Japan

[73] Assignee: NEC Corporation, Tokyo, Japan

[21] Appl. No.: 702,815

[22] Filed: May 17, 1991

[30] Foreign Application Priority Data

May 17, 1990 [JP] Japan .................. 2-128054

[51] Int. Cl.[5] .................. H03G 3/30; H02M 7/217
[52] U.S. Cl. .................. 330/254; 307/261; 328/26; 330/256; 330/280; 363/127
[58] Field of Search .................. 330/254, 256, 280; 328/26; 307/261; 363/127; 329/352, 363, 364

[56] References Cited

U.S. PATENT DOCUMENTS 4,724,337  2/1988  Maeda et al. .................. 330/256 X

*Primary Examiner*—James B. Mullins
*Attorney, Agent, or Firm*—Helfgott & Karas

[57] ABSTRACT

A detector for use in an automatic gain control amplifier and operated to generate a gain control voltage in response to an amplitude of the output signal of an amplifier circuit includes five transistors connected in a detector circuit. The first transistor receives a bias voltage at its base and the second transistor receives a true signal of an input signal along with the bias voltage at its base. The third transistor receives a complementary signal of the input signal along with the bias voltage at its base. A first current source is connected in common to the emitters of the first to third transistors. A control voltage is supplied between the bases of the fourth and fifth transistors. A second current source supplies an operating current to the fourth and fifth transistors. A first load is connected in common to the collectors of the first and the fourth transistors. A second load is connected in common to the collectors of the second, third and fifth transistors. A first output terminal of the detector is connected to the collectors of the first and fourth transistors, and a second output terminal of the detector is connected to the collectors of the second, third and fifth transistors. The detector reduces or eliminates temperature dependence of the amplitude of the output of the amplifier circuit.

12 Claims, 4 Drawing Sheets

DETECTOR FOR AUTOMATIC GAIN CONTROL AMPLIFIER CIRCUIT

BACKGROUND OF THE INVENTION

1. Field of the Invention

The present invention relates to a detector and, more particularly, to a detector for an automatic gain control amplifier circuit (referred to as an "AGC amplifier" hereinafter).

2. Description of the Prior Art

An AGC amplifier includes an amplifier for amplifying an input signal and a detector circuit for generating a gain control voltage in response to the amplitude of the output signal from the amplifier. The gain control voltage is fed back to the amplifier to control the gain thereof.

The detector includes generally a rectifier circuit rectifying the output signal of the amplifier to output a rectified signal, a smoothing circuit smoothing the rectified output to output a smoothed signal, and a control circuit generating the gain control voltage by comparing the smoothed signal with a control voltage.

Such a detector is shown in FIG. 1, in which true and complementary signals are represented by signal sources 213 and 214, respectively. These signals are supplied to a full-wave rectifier circuit 2 along with a bias voltage $V_B$. The rectifier 2 consists of transistors 201 and 202 and a constant current source 3 and produces a full-wave rectified signal at the common emitter of transistors 201 and 203. This signal is smoothed by a smoothing circuit 4 consisting of a resistor 204 and a capacitor 211. A d.c. voltage corresponding to the amplitude of the output signal of the amplifier is thus obtained. This d.c. voltage is compared with a control voltage 259 by a control circuit 5 consisting of transistors 250 and 251, resistors 253 to 256 and a constant current source 252, so that the gain control voltage is produced between output terminals 360 and 361.

Assuming that the voltages of the input signals 213 and 214 are $V_{IN1}$ and $V_{IN2}$, respectively; the collector currents of the transistors 201 and 202 are $I_{C1}$ and $I_{C2}$, respectively; and the common emitter voltage of the transistors 201 and 202 is $V_E$, the following equations (1) and (2) are obtained:

$$V_{IN1} - V_E = v_T \ln \frac{I_{C1}}{I_S} \quad (1)$$

$$V_{IN2} - V_E = v_T \ln \frac{I_{C2}}{I_S} \quad (2)$$

where $v_T$ is the thermal voltage of the transistor and $I_S$ is the reverse saturation current of the transistor.

Since the input voltages $V_{IN1}$ and $V_{IN2}$ are represented as follows:

$$V_{IN1} = v_{in} + V_B, \quad (3)$$

$$V_{IN2} = -v_{in} + V_B, \quad (4)$$

where $v_{in}$ is the a.c. component of the signals 213 and 214, the equations (1) and (2) change as follows:

$$v_{in} + V_B - V_E = v_T \ln \frac{I_{C1}}{I_S}, \quad (5)$$

$$-v_{in} + V_B - V_E = v_T \ln \frac{I_{C2}}{I_S} \quad (6)$$

From equations (5) and (6), equation (7) is obtained:

$$2V_B - 2V_E = v_T \ln \frac{I_{C1} I_{C2}}{I_S^2}. \quad (7)$$

Assuming that the mutual conductance of the rectifier circuit 2 is gm and the current of the current source 3 is $2I_O$ ($I_O >$ gm $v_{in}$), the following equations (8) and (9) are derived:

$$I_{C1} \approx I_O + 2v_{in} gm, \quad (8)$$

$$I_{C2} \approx I_O - 2v_{in} gm. \quad (9)$$

Accordingly, Eq. (7) can be rewritten as follows:

$$2V_B - 2V_E = v_T \ln \left\{ \frac{(I_O + 2v_{in} gm)(I_O - 2v_{in} gm)}{I_S^2} \right\}, \quad (10)$$

or $$2V_B - 2V_E = v_T \ln \left\{ \frac{I_O^2}{I_S^2} \left( 1 - \frac{4v_{in}^2 gm^2}{I_O^2} \right) \right\} \quad (11)$$

With the above-mentioned assumption of $I_O > v_{in}$ gm Eq. (11) becomes as follows:

$$2V_B - 2V_E \approx 2v_T \ln \frac{I_O}{I_S} - v_T \cdot \frac{4v_{in}^2 gm^2}{I_O^2} \quad (12)$$

Further, using the expression for gm in terms of $v_T$ and $I_O$ $$gm = \frac{2I_O}{4v_T} = \frac{I_O}{2v_T}. \quad (13)$$

Accordingly, $V_E$ can be taken out from the common emitter of the transistors 201 and 202, and can be given by $$V_E = \frac{v_{in}^2}{2v_T} + V_B - v_T \ln \frac{I_O}{I_S}. \quad (14)$$

Next, if the signal is assumed to be a sine wave with amplitude $V_a$, namely, $v_{in} = V_a \sin \omega t$, where $\omega$ is the angular frequency of the signal, $V_E$ given by Eq. (14) can be given by the following equation:

$$V_E = \frac{V_a^2 \sin^2 \omega t}{2v_T} + V_B - v_T \ln \frac{I_O}{I_S}. \quad (15)$$

Therefore, the detected amplitude output after smoothing $V_{Ea}$ is given by:

$$V_{Ea} = \frac{1}{(2\pi/\omega)} \int_0^{2\pi/\omega} |V_E| dt \quad (16)$$

-continued $$= \frac{1}{(2\pi/\omega)} \int_0^{2\pi/\omega} \left( \frac{V_a^2 \sin^2 \omega t}{2v_T} + V_B - v_T \ln \frac{I_O}{I_S} \right) dt$$

$$= \frac{\omega V_a^2}{4\pi v_T} \left[ \frac{t}{2} - \frac{\sin^2 \omega t}{4} \right] \int_0^{2\pi/\omega} + V_B - v_T \ln \frac{I_O}{I_S}$$

$$= \frac{V_a^2}{4v_T} + V_B - v_T \ln \frac{I_O}{I_S}.$$

The output after the smoothing is taken out from a terminal 7, and is a dc voltage which is directly proportional to the square of the signal amplitude $V_a^2$ and is inversely proportional to the thermal voltage $v_T$.

Next, the smoothed output $V_{Ea}$ is supplied to the control circuit 5 and compared with a variable voltage source 259 as a control voltage. If the voltage of the variable voltage source 259 is $V_{X1}$, the current of the current source 252 is $2I_O$, and the resistances of the resistors 253, 254, 255 and 256 are set to be $R_L$, $R_L$, $R_E$ and $R_E$, respectively, the differential output $V_{DET1}$ (the differential voltage between the terminals 360 and 361) of the control circuit 5 is given by $$V_{DET1} = \frac{R_L}{2R_E + \frac{2V_T}{I_O}} (V_{Ea} - V_{X1}). \quad (17)$$

This voltage $V_{DET1}$ is used for the gain control of the amplifier.

The overall construction of the AGC amplifier including the detector is shown in FIG. 2. More specifically, an AGC detector 304 is constructed as shown in FIG. 1, and the gain control voltage from the detector 304 is amplified by a differential amplifier 301 and then supplied to a variable gain amplifier 350 as a gain control voltage $V_{AGC}$. The true and complementary outputs of the amplifier 350 are supplied to an emitter-follower amplifier 310, the outputs of which are connected to the output terminals 312 and 313 and further to the detector 304 through a differential amplifier 303. The output terminals 312 and 313 are connected to the following circuit which is not shown. The variable gain amplifier 350 is of a double differential amplifier type which is widely used in an IC circuit. An input signal $v_{1A}$ to be amplified with a gain control is supplied to the base of a transistor 325, and the outputs of the amplifier 350 are derived from the collectors of transistors 321 and 324. The gain of the variable gain amplifier 350 is controlled by the difference in voltage between the common base of the transistors 321 and 324 and that of the transistors 322 and 323. When the voltage difference becomes smaller than 0.1 V, the gain of the amplifier 350 starts to change. In other words, the AGC function starts to operate when the differential voltage becomes 0.1 V. Since the voltage difference is amplified by the differential amplifier 301, the AGC function starts to operate when the difference in input voltage to the differential amplifier 301 is 1 mV, assuming the gain of the differential amplifier 301 to be 100. Thus, the AGC starts to operate when the gain control voltage $V_{DET1}$ of the control circuit 5 satisfies the following condition:

$$V_{DET1} \approx 0. \quad (18)$$

Namely, from Eqs. (18) and (17), when $$V_{Ea} = V_{X1}. \quad (19)$$

The AGC starts to operate. From Eqs. (16) and (19) there is obtained $$V_{X1} = \frac{V_a^2}{4v_T} + V_B - v_T \ln \frac{I_O}{I_S}. \quad (20)$$

Referring to FIG. 3, the voltage source 259 (FIG. 1) includes an operational amplifier 401, resistors $R_x$ and $R_y$, a transistors 402 and a current source 404. Therefore, the voltage $V_{X1}$ at the terminal 260 can be given as follows:

$$V_{X1} = \frac{R_x + R_y}{R_x} \cdot V_B - v_T \ln \frac{I_1}{I_S}. \quad (21)$$

From Eqs. (20) and (21) there is obtained $$\frac{R_y}{R_x} \cdot V_B = \frac{V_a^2}{4v_T} - v_T \ln \frac{I_O}{I_1}. \quad (22)$$

Since Va is the amplitude of the input signal $v_{in}$ of the AGC detector in the AGC amplifier shown in FIG. 2, the output of the AGC amplifier is smaller than the signal $v_{in}$ by a factor of the gain of the post-stage amplifier 303. Assuming that the output of the AGC amplifier is $v_{oa}$ and the gain of the post-stage amplifier 303 is $A_{op}$, the signal $v_{in}$ is represented as follows:

$$v_{in} = A_{op} v_{oa}. \quad (23)$$

Accordingly, the following equation is obtained:

$$V_a = A_{op} V_{oa}. \quad (24)$$

where $V_{oa}$ is the amplitude of $v_{oa}$. The substitution of Eq. (24) into Eq. (22) results in as follows:

$$\frac{R_y}{R_x} \cdot V_B = \frac{A_{op}^2 V_{oa}^2}{4v_T} - v_T \ln \frac{I_O}{I_1}. \quad (25)$$

Thus, $$V_{oa} = \frac{2}{A_{op}} \sqrt{v_T \left( \frac{R_y}{R_x} \cdot V_B + v_T \ln \frac{I_O}{I_1} \right)}. \quad (26)$$

The above equation shows that $V_{oa}$ which is the output amplitude of the AGC amplifier can be controlled by the resistance ratio of $R_y$ to $R_x$. That is, the output of the AGC amplifier can be controlled by the variable voltage source 259.

However, as apparent from equation (26), the output amplitude $V_{oa}$ of the AGC amplifier depends heavily on the terminal voltage $v_T$ of the transistor. For example, $V_{oa}$ changes by about 17% for a temperature change of 100° C. so that the output of the AGC amplifier is scattered over a wide range depending upon the temperature. Moreover, $V_{X1}$ is given by the circuit shown in FIG. 3, resulting in increase in the number of elements.

SUMMARY OF THE INVENTION

Therefore, it is an object of the present invention to provide an improved detector.

It is another object of the present invention to provide a detector suitable for an automatic gain control amplifier circuit to eliminate or reduce the temperature dependence of the output amplitude of a variable gain amplifier.

A detector according to the present invention comprises a first transistor receiving a bias voltage at its base, a second transistor receiving a true signal of an input signal along with the bias voltage at its base, a third transistor which receives a complementary signal of the input signal along with the bias voltage at its base, a first current source connected in common to the emitters of the first to third transistors, fourth and fifth transistors having bases between which a control voltage is supplied, a second current source for supplying an operating current to the fourth and the fifth transistors, a first load connected in common to the collectors of the first and the fourth transistors, a second load connected in common to the collectors of the second, the third and the fifth transistors, a first output terminal which is connected to the collectors of the first and the fourth transistors and a second output terminal connected to the collectors of the second, the third and the fifth transistors.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 4:
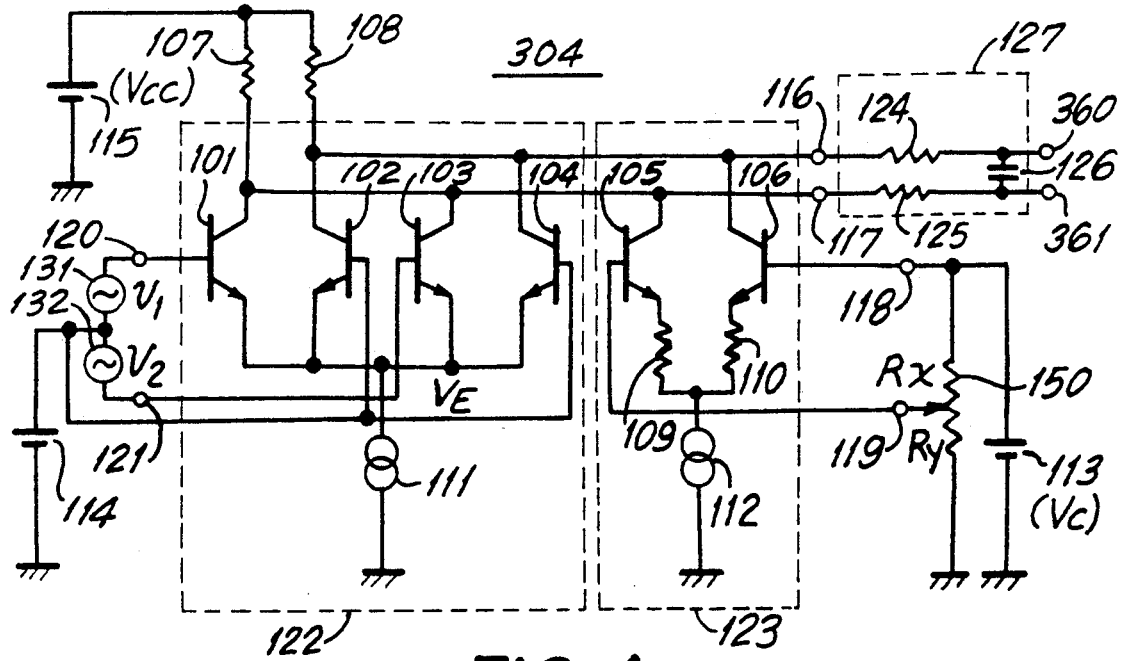
FIG. 4 is a circuit diagram of an embodiment of the present invention.

Referring to FIG. 4, the AGC detector 304 according to an embodiment of the present invention includes a full-wave rectifier circuit 122 consisting of four transistors 101 to 104, load resistors 107 and 108 and a current source 111, a differential circuit 123 consisting of transistors 105 and 106, resistors 109 and 110 and a current source 112, a smoothing circuit 127 consisting of resistors 124 and 125 and a capacitor 126, a variable resistor 150, and a control voltage source 113.

True and complementary signals, i.e. signals having an opposite phase to each other, of an input signals are represented as signal sources 131 and 132, respectively. These signals 131 and 132 are supplied to the bases of the transistors 101 and 103 through the input terminals 120 and 121, respectively, together with a bias voltage 114. The transistors 102 and 104 receive only bias voltage 114. The emitters of the transistors 101 to 104 are connected in common to the current source 111. The collectors of the transistors 101, 103 and 105 are connected in common to the load resistor 107 and the collectors of the transistors 102, 104 and 106 are connected in common to the load resistor 108. The control voltage source 113 is connected to the base of the transistor 106 via a first control terminal 118, and the tap of the variable resistor 150 is connected via a second control terminal 119 to the base of the transistor 105 to receive a resistance-divided voltage of the control voltage 113. The junction of the resistor 124 and the capacitor 126, and the junction of the resistor 125 and the capacitor 126 serve as the output terminals 360 and 361, respectively, of the AGC detector. The resistors 107 and 108 have the same resistance value to each other. The resistance values of the resistors 109 and 110 are also equal to each other.

Accordingly, a first full-wave rectified signal of the input signal appears across the resistor 107, and a second full-wave rectified signal having a polarity opposite to that of the first rectified signal appears across the resistor 108. These signals are smoothed by the circuit 127, so that a gain control voltage depending upon the amplitude of the input signal is produced between the terminals 360 and 361. Since the d.c. bias voltage is controlled by the differential circuit 123 in response to the control voltage between the terminals 115 and 119, the amount and polarity of the gain control voltage between the terminals 360 and 361 are controlled by the circuit 123 and the variable resistor 150. Thus, the level at which the AGC function starts to operate is controlled.

Assume now that the resistance value of each load resistor 107 (108) is $R_{L1}$; the resistance value of each emitter resistor 109 (110), $R_E$; the current of the current source 111, $I_1$; the current of the current source 112, $I_2$; the dc bias voltage of the dc bias source 114, $V_B$; the signals of the input signal sources 131 and 132, $v_1$ and $v_2$; the voltage of the control voltage source 113, $V_c$; the resistance value between the tap of the variable resistor and the terminal 118, 150, $R_x$; the resistance value between the tap of the variable resistor 150 and the ground, $R_y$; the collector currents of the transistors 101 to 106, $I_{C1}$ to $I_{C6}$; and the voltage of the common emitters of the transistors 101 to 104, $V_E$.

Since the input signals 131 and 132 differ in phase by 180° and have the same ac amplitude and dc bias voltage, the base potential $V_1$ of the transistor 101 and the base potential $V_2$ of the transistor 103 can be represented as follows:

$$v_1 = v_{al} + V_B, \tag{27}$$

$$v_2 = -V_{al} + V_B, \tag{28}$$

where $v_{al}$ is the ac signal component.

In terms of $I_{C1}$ to $I_{C4}$, $V_E$ and $v_1$ and $v_2$ given by Eqs. (27) and (28), the voltage between the base and emitter for each of the transistors 101 to 104 can be represented as shown below.

$$v_{al} + V_B - V_E = v_T \ln \frac{I_{C1}}{I_S}, \tag{29}$$

$$V_B - V_E = v_T \ln \frac{I_{C2}}{I_S}, \tag{30}$$

$$-v_{al} + V_B - V_E = v_T \ln \frac{I_{C3}}{I_S}, \tag{31}$$

$$V_B - V_E = v_T \ln \frac{I_{C4}}{I_S} \tag{32}$$

Solving Eqs. (29) to (32) for $I_{C1}$ to $I_{C4}$ there are obtained.

$$I_{C1} = I_s \exp\left(\frac{v_{al} + V_B - V_E}{v_T}\right), \tag{33}$$

$$I_{C2} = I_s \exp\left(\frac{V_B - V_E}{v_T}\right), \tag{34}$$

$$I_{C3} = I_s \exp\left(\frac{-v_{al} + V_B - V_E}{v_T}\right), \tag{35}$$

$$I_{C4} = I_s \exp\left(\frac{V_B - V_E}{v_T}\right). \tag{36}$$

Next, representing the above equations for $I_{C2}$ to $I_{C4}$ in terms of $I_{C1}$ one obtains $$\begin{aligned} I_{C2} &= I_S \exp\left(\frac{V_B - V_E}{v_T}\right) \\ &= I_S \exp\left(\frac{v_{al} + V_B - V_E}{v_T}\right) \cdot \exp\left(\frac{-v_{al}}{v_T}\right) \\ &= I_{C1} \cdot \exp\left(-\frac{v_{al}}{v_T}\right), \end{aligned} \tag{37}$$

$$\begin{aligned} I_{C3} &= I_S \exp\left(\frac{-v_{al} + V_B - V_E}{v_T}\right) \\ &= I_S \exp\left(\frac{v_{al} + V_B - V_E}{v_T}\right) \cdot \exp\left(\frac{-2v_{al}}{v_T}\right) \\ &= I_{C1} \cdot \exp\left(-\frac{2v_{al}}{v_T}\right), \end{aligned} \tag{38}$$

$$I_{C4} = I_{C2} = I_{C1} \exp\left(\frac{v_{al}}{v_T}\right) \tag{39}$$

Since there holds $$I_{C1} + I_{C2} + I_{C3} + I_{C4} = I_1, \tag{40}$$

substitution of Eqs. (37) to (39) into Eq. (40) gives $$I_{C1} + I_{C2} + I_{C3} + I_{C4} = I_{C1} + I_{C1} \cdot \exp\left(-\frac{v_{al}}{v_T}\right) + \tag{41}$$

$$I_{C1} \cdot \exp\left(-\frac{2V_{al}}{v_T}\right) + I_{C1} \cdot \exp\left(-\frac{v_{al}}{v_T}\right) = I_1.$$

By solving Eq. (41) for $I_{C1}$ one obtains $$I_{C1} = \frac{I_1}{1 + 2\exp\left(-\frac{v_{al}}{v_T}\right) + \exp\left(-\frac{2v_{al}}{v_T}\right)}. \tag{42}$$

Rearranging Eq. (42) there is obtained $$I_{C1} = \frac{I_1 \cdot \exp\left(\frac{v_{al}}{v_T}\right)}{\exp\left(\frac{v_{al}}{v_T}\right) + \exp\left(-\frac{v_{al}}{v_T}\right) - 2}. \tag{43}$$

Then, from Eqs. (37) and (39) one obtains $$I_{C2} = I_{C4} = \frac{I_1}{\exp\left(\frac{v_{al}}{v_T}\right) + \exp\left(-\frac{v_{al}}{v_T}\right) + 2} \tag{44}$$

and from Eq. (38)

$$I_{C3} = \frac{I_1 \cdot \exp\left(-\frac{v_{al}}{v_T}\right)}{\exp\left(\frac{v_{al}}{v_T}\right) + \exp\left(-\frac{v_{al}}{v_T}\right) + 2} \tag{45}$$

The current $I_{L1}$ that flows in the load resistor 107 is given (assuming that $I_2=0$) by $$I_{L1} = I_{C1} + I_{C3} = \frac{I_1\left\{\exp\left(\frac{v_{al}}{v_T}\right) + \exp\left(-\frac{v_{al}}{v_T}\right)\right\}}{\exp\left(\frac{v_{al}}{v_T}\right) + \exp\left(-\frac{v_{al}}{v_T}\right) + 2} \tag{46}$$

The current $I_{L2}$ that flows in the load resistor (108) (assuming that $I_2=0$) by $$I_{L2} = I_{C2} + I_{C4} = \frac{2I_1}{\exp\left(\frac{v_{al}}{v_T}\right) + \exp\left(-\frac{v_{al}}{v_T}\right) + 2}. \tag{47}$$

Accordingly, the differential voltage $V_0$ between the terminals 116 and 117 for $I_2=0$ which can be represented by $$V_0 = R_{L1}(I_{L1} - I_{L2}) \tag{48}$$

becomes, after substitution of Eqs. (46) and (47) into Eq. (48), $$V_0 = R_{L1} \cdot \frac{\exp\left(\frac{v_{al}}{v_T}\right) + \exp\left(-\frac{v_{al}}{v_T}\right) - 2}{\exp\left(\frac{v_{al}}{v_T}\right) + \exp\left(-\frac{v_{al}}{v_T}\right) + 2} \cdot I_1. \tag{49}$$

Next, the transfer conductance of $I_{L1} - I_{L2} = \Delta I_L$ with respect to $v_{al}$ will be determined. For that purpose, from Eq. (49) one notes that $$\Delta I_L = \frac{\exp\left(\frac{v_{al}}{v_T}\right) + \exp\left(-\frac{v_{al}}{v_T}\right) - 2}{\exp\left(\frac{v_{al}}{v_T}\right) + \exp\left(-\frac{v_{al}}{v_T}\right) + 2} \cdot I_1 \tag{50}$$

Then, the transfer conductance $g_{mL}$ is given by $$g_{mL} = \frac{d\Delta I_L}{dv_{al}} = \frac{4\left\{\exp\left(\frac{v_{al}}{v_T}\right) - \exp\left(-\frac{v_{al}}{v_T}\right)\right\}I_1}{\left\{\exp\left(\frac{v_{al}}{v_T}\right) + \exp\left(-\frac{v_{al}}{v_T}\right) + 2\right\}^2 v_T} \quad (51)$$

The portion where $g_{mL}$ is constant can be found by setting $$\frac{dg_{mL}}{dv_{al}} = \frac{2\left\{\exp\left(\frac{v_{al}}{v_T}\right) + \exp\left(-\frac{v_{al}}{v_T}\right)\right\} + 6 - \exp\left(\frac{2v_{al}}{v_T}\right) - \exp\left(-\frac{2v_{al}}{v_T}\right)}{\left\{\exp\left(\frac{v_{al}}{v_T}\right) + \exp\left(-\frac{v_{al}}{v_T}\right) + 2\right\}^4} \cdot \frac{4I_1}{v_T^2} \quad (52)$$

to be equal to zero. By writing $$\exp\left(\frac{v_{al}}{v_T}\right) = y$$

the equation to be solved is $$2\left(y + \frac{1}{y}\right) + 6 - y^2 - \frac{1}{y^2} = 0. \quad (53)$$

or $$2\left(y + \frac{1}{y}\right) + 6 - \left(y + \frac{1}{y}\right)^2 + 2 = 0. \quad (54)$$

By further writing $(y+1/y)=Z$, Eq. (54) becomes $$2Z - Z^2 + 8 = 0 \quad (55)$$

or $$Z^2 - 2Z - 8 = 0. \quad (56)$$

The solution to Eq. (56) is $$Z = 4 \quad (57)$$

so that $$y + 1/y = 4. \quad (58)$$

Solving Eq. (58) one obtains $$y = 2 + \sqrt{3} \quad (59)$$

Further, $g_{mL}$ given by Eq. (51) can be expressed in terms of y as $$g_{mL} = \frac{4\left(y - \frac{1}{y}\right)}{\left(y + \frac{1}{y} + 2\right)^2} \cdot \frac{I_1}{v_T} \quad (60)$$

which gives the value $$g_{mL} \approx 0.39 \cdot I_1/v_T \quad (61)$$

that may further be approximated as $$g_{mL} \approx 0.4 \cdot I_1/v_T. \quad (62)$$

Therefore, $\Delta I_L$ can be given by the following:

$$\Delta I_L \approx g_{mL} \cdot v_{al} = 0.4 \cdot \frac{I_1}{v_T} \cdot v_{al} \quad (63)$$

Accordingly, the differential voltage $V_0$ between the terminals 116 and 117 when $I_2=0$ is given by $$V_0 = R_{L1} \cdot \Delta I_L = 0.4 \cdot \frac{R_{L1} I_1}{v_T} \cdot v_{al} \quad (64)$$

Next, let us consider the differential voltage between the terminals 116 and 117 when $I_2$ is nonvanishing. Let us call the collector current of the transistors 105 and 106 $I_5$ and $I_6$, respectively. First, the current $I_{L3}$ that flows in the load resistor 107 is given by $$I_{L3} = I_{C1} + I_{C3} + I_5 = I_{L1} + I_5. \quad (65)$$

and the current $I_{L4}$ that flows in the load resistor 108 is given by $$I_{L4} = I_{C2} + I_{C4} + I_6 = I_{L2} + I_6 \quad (66)$$

Therefore, the differential voltage $V_0'$ between the terminals 116 and 117 when $I_2 \neq 0$ is given by $$V_0' = R_{L1}(I_{L3} - I_{L4}) = R_{L1}(I_{L1} - I_{L2}) + R_{L1}(I_5 - I_6) \quad (67)$$

$$= R_{L1} \Delta I_L + R_{L1}(I_5 - I_6). \quad (68)$$

Substituting Eq. (63), $$V_0' = 0.4 \cdot \frac{R_{L1} I_1}{v_T} \cdot v_{al} + R_{L1}(I_5 - I_6) \quad (69)$$

$$= 0.4 \cdot \frac{R_{L1} I_1}{v_T} \cdot v_{al} - R_{L1}(I_6 - I_5). \quad (70)$$

When a differential voltage is applied to the bases of the transistors 105 and 106 so as to have $I_6 > I_5$ and the base voltage of the transistor 106 is $V_C$, the base voltage of the transistor 105 becomes $[R_y/(R_x+R_y)] \cdot V_C$ and $I_6 - I_5$ is given by the following expression:

$$I_6 - I_5 = 2 \cdot \frac{1}{2R_E + \frac{2v_T}{I_2}} \cdot \frac{R_x}{R_x + R_y} \cdot V_C \quad (71)$$

$$= \frac{1}{R_E + \frac{2v_T}{I_2}} \cdot \frac{R_x}{R_x + R_y} \cdot V_C$$

Therefore, from Eq. (70) there is obtained $$V_0' = 0.4 \cdot \frac{R_{L1} I_1}{v_T} v_{al} - \frac{R_{L1}}{R_E + \frac{2v_T}{I_2}} \cdot \frac{R_x}{R_x + R_y} \cdot V_C \quad (72)$$

Figure 5:
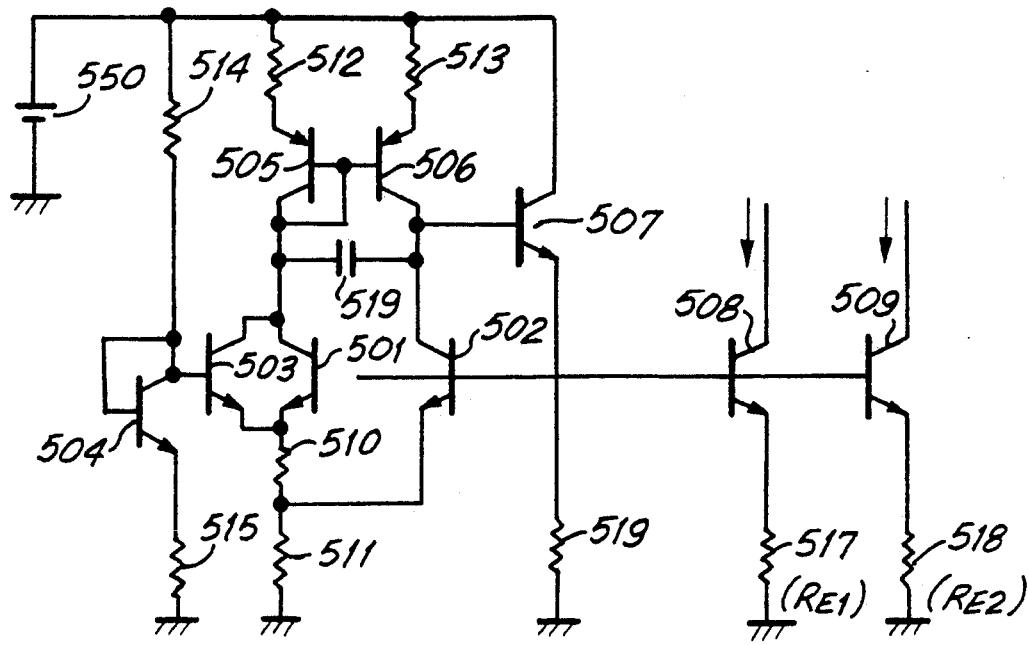
FIG. 5 is a circuit diagram of a band gap regulator.

Now, let us assume that $I_1$ and $I_2$ are currents of band gap type current sources and a temperature correction is to be applied. More specifically, use will be made of a band gap regulator shown in FIG. 5. Here, let us assume that the ratio of the emitter areas of the transistors 501 and 502 is 1: N, the collector current of the transistor 501 is $I_{501}$, the collector current of the transistor 502 is $I_{502}$, the resistances of the resistors 510, 511, 517 and 518 are $r_1$, $r_2$, $R_{E1}$ and $R_{E2}$, respectively, and the common base potential of the transistors 501 and 502 is $V_{BG}$. Then, the collector currents of the transistors 501 and 502 become substantially equal, that is, $$I_{501} = I_{502} = I \quad (73)$$

due to a feedback circuit containing a current mirror consisting of the transistors 505 and 506, and the like, as shown in FIG. 5. Next, it is to be noted that the voltage difference between the base and the emitter of the transistors 501 and 502 is determined by the ratio N of the emitter areas $$V_{BE(Q502)} = V_{BE(Q501)} + r_1 I \quad (74)$$

that is $$v_T \ln \frac{I_{502}}{I_S} = v_T \ln \frac{I_{501}}{N I_S} + r_1 I \quad (75)$$

Substitution of Eq. (73) into Eq. (75) and rearranging gives $$v_T \ln N = r_1 I \quad (76)$$

Since the current that flows in the resistor 511 is $2I$, the emitter voltage of the transistor 502 is given, using Eq. (76), by $$V_{E(Q502)} = 2 I r_2 = 2 v_T \frac{r_2}{r_1} \ln N. \quad (77)$$

Accordingly, the common base potential $V_{BG}$ of the transistors 501 and 502 becomes $$V_{BG} = V_{BE(Q502)} + 2 v_T \frac{r_2}{r_1} \ln N. \quad (78)$$

Next, when the current source 111 of the present embodiment is replaced by the current source consisting of a transistor 508 and a resistor 517 in FIG. 5, and the current source 112 of the present embodiment is replaced by the current source consisting of a transistor 509 and a resistor 518, the current $I_1$ of the current source 111, for the case when all of the voltages between the base and the emitter for the transistors 502, 508 and 509 can be regarded equal, can be given by $$I_1 = \frac{V_{BG} - V_{BE(Q508)}}{R_{E1}} = \frac{V_{BG} - V_{BE(Q502)}}{R_{E1}} = \frac{2 v_T \cdot \frac{r_2}{r_1} \cdot \ln N}{R_{E1}}, \quad (79)$$

Similarly, the current $I_2$ of the current source 112 is given by $$I_2 = \frac{V_{BG} - V_{BE(Q509)}}{R_{E2}} = \frac{V_{BG} - V_{BE(Q502)}}{R_{E2}} = \frac{2 v_T \cdot \frac{r_2}{r_1} \cdot \ln N}{R_{E2}} \quad (80)$$

By writing $$I_1 = \frac{2 \cdot \frac{r_2}{r_1} \cdot \ln N}{R_{E1}} \cdot v_T = k_1 v_T \quad (81)$$

$$I_2 = \frac{2 \cdot \frac{r_2}{r_1} \cdot \ln N}{R_{E2}} \cdot v_T = k_2 v_T \quad (82)$$

to simplify the computations, Eq. (72) now reads $$V_0' = 0.4 k_1 R_{L1} v_{al} - \frac{R_{L1}}{R_E + 2 \cdot \frac{1}{k_2}} \cdot \frac{R_x}{R_x + R_y} \cdot V_C \quad (83)$$

The differential voltage $V_0'$ between the terminals 116 and 117 is smoothed by the smoothing circuit or low pass filter 127, and is output from the output terminals 360 and 361 of the AGC detector.

Assuming that $v_{al} = a \sin \omega t$, where $a$ is the signal amplitude and $\omega$ is the angular frequency, the output $V_0''$ following the smoothing is given by $$V_0'' = \frac{1}{(2\pi/\omega)} \int_0^{2\pi/\omega} |0.4 k_1 R_{L1} a \sin \omega t| dt - \frac{1}{(2\pi/\omega)} \int_0^{2\pi/\omega} \frac{R_{L1}}{R_E + \frac{2}{k_2}} \cdot \frac{R_x}{R_x + R_y} \cdot V_C \cdot dt$$

$$= \frac{0.2 k_1 R_{L1} a}{\pi} - \frac{R_{L1}}{R_E + \frac{2}{k_2}} \cdot \frac{R_x}{R_x + R_y} \cdot V_C. \quad (84)$$

Figure 1:
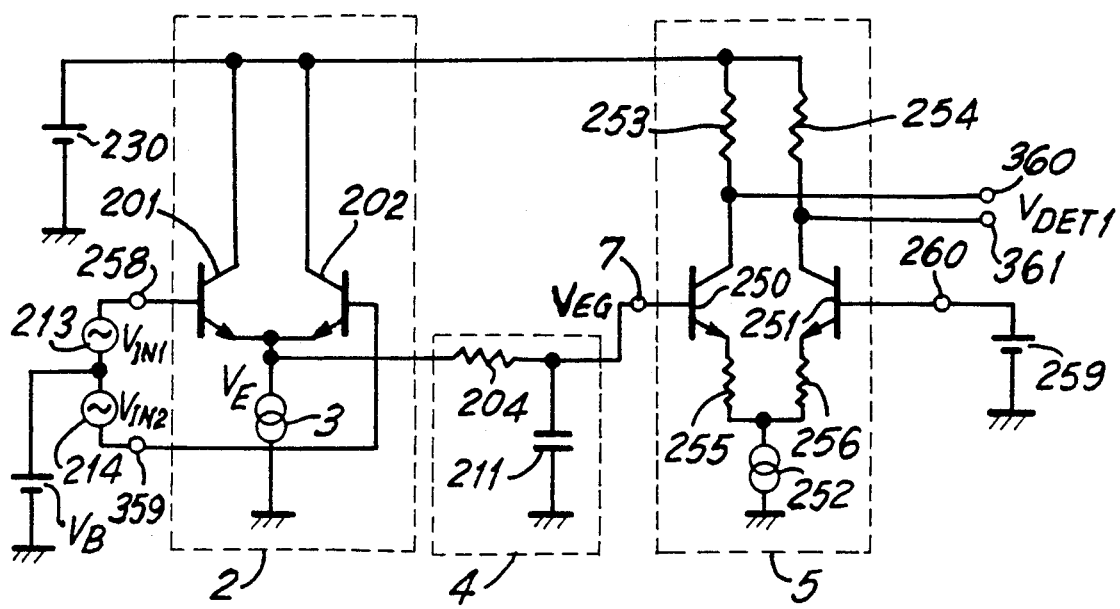
FIG. 1 is a circuit diagram of the prior art AGC detector.
Figure 2:
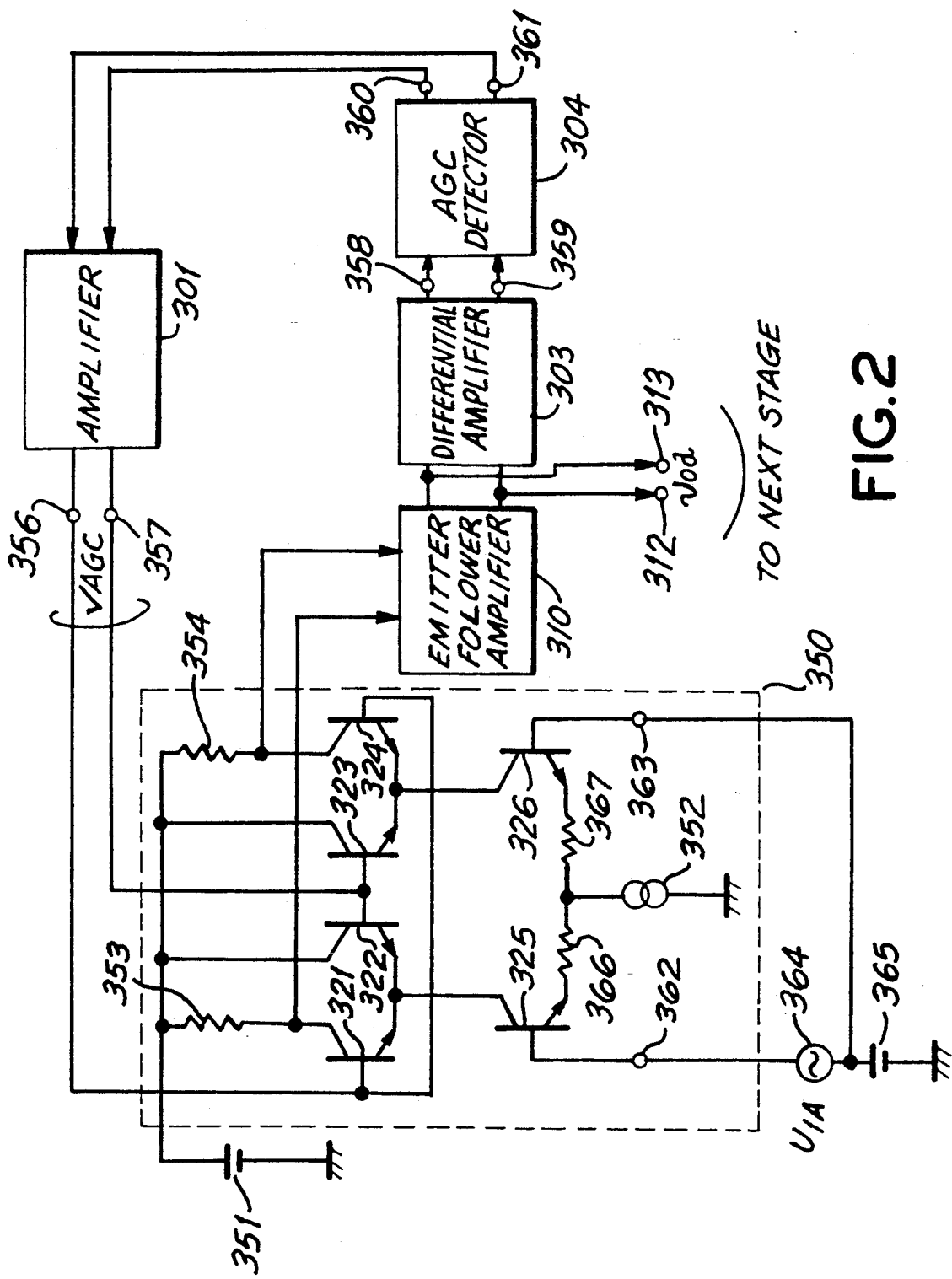
FIG. 2 is an overall system block diagram of the AGC amplifier.
Figure 3:
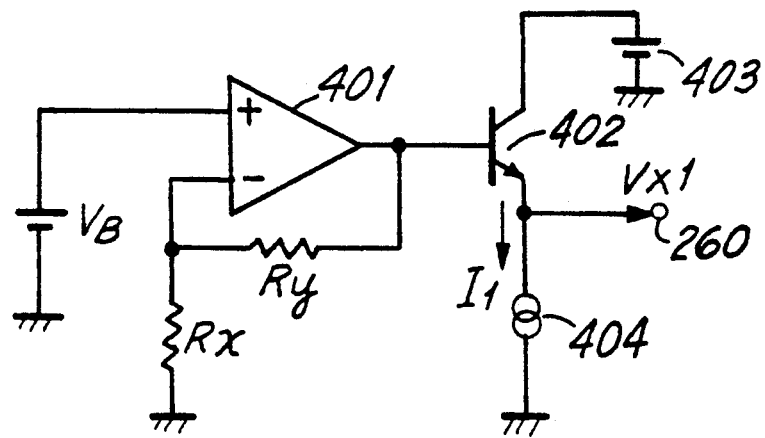
FIG. 3 is a circuit diagram of a control voltage source shown in FIG. 2.

The AGC detection output according to the present embodiment is given by Eq. (84), and when the AGC detector shown in FIG. 4 is applied to the AGC amplifier in FIG. 2, the AGC function starts to be operative in the vicinity of vanishing output of the AGC detector as mentioned in connection with the prior art device.

The requirement that $$V_0'' = 0 \quad (85)$$

shows from Eq. (84) that AGC starts to be operative when $$\frac{0.2 k_1 R_{L1} a}{\pi} = \frac{R_{L1}}{R_E + \frac{2}{k_2}} \cdot \frac{R_x}{R_x + R_y} \cdot V_C \quad (86)$$

Since the gain of the post-stage amplifier is $A_{op}$, the output $V_{oa}$ of the AGC amplifier is given by $$v_{oa} = \frac{a}{A_{op}} = \frac{\pi}{0.2 k_1 A_{op}} \cdot \frac{1}{R_E + \frac{2}{k_2}} \cdot \frac{R_x}{R_x + R_y} \cdot V_C \quad (87)$$

showing that the output $V_{oa}$ can be controlled by the control voltage $V_C$.

By substituting back the expressions for $k_1$ and $k_2$ from Eqs. (81) and (82) into Eq. (87), $V_{oa}$ can be represented by $$V_{oa} = \frac{\pi R_{E1}}{0.4 A_{op} \frac{r_2}{r_1} \ln N} \cdot \frac{1}{R_E + \frac{R_{E2}}{\frac{r_2}{r_1} \ln N}} \cdot \frac{R_x}{R_x + R_y} \cdot V_C \quad (88)$$

As can be seen from Eq. (88), assuming that the gain $A_{op}$ of the post-stage amplifier and the voltage $V_C$ of the control voltage source are constant, the output $V_{oa}$ of the AGC amplifier in accordance with the present invention is absolutely stable against the temperature fluctuations due to the absence of the thermal voltage $v_T$ of the transistor. Moreover, it has an effect that it is also completely stable against the fluctuations in the supply voltage due to the absence of a term involving the supply voltage Vcc, and that it is absolutely stable against the irregularity in the performance of the elements.

Figure 6:
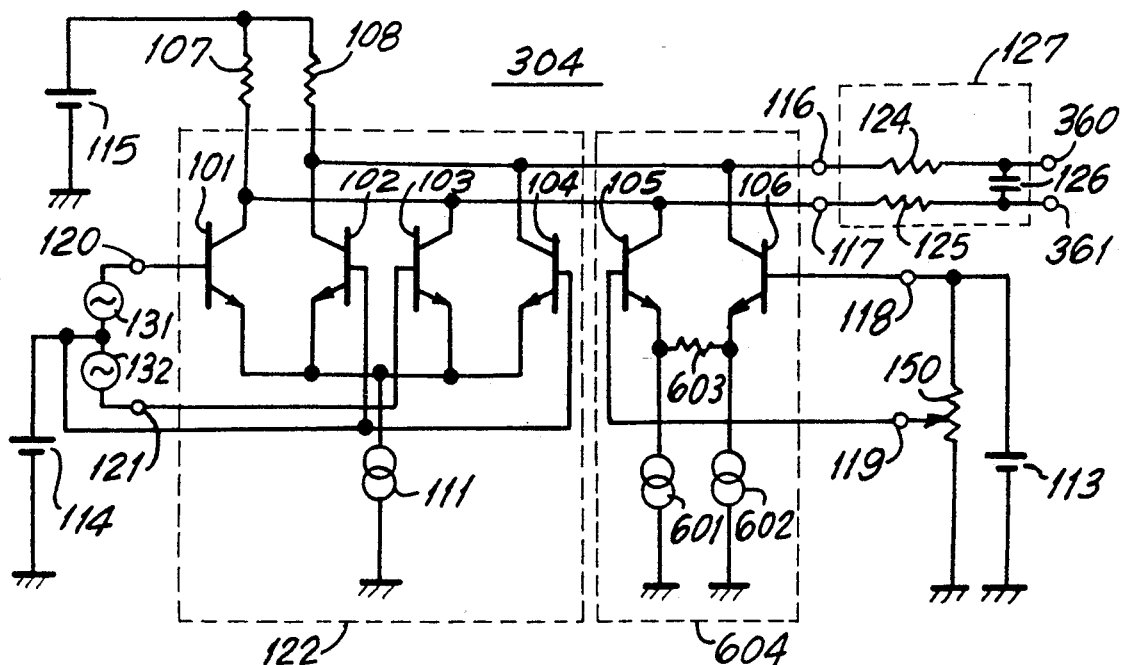
FIG. 6 is a circuit diagram of another embodiment of the present invention.

FIG. 6 shows a circuit diagram for another embodiment of the present invention. The components in the figure which are identical to those in the circuit diagram for the one embodiment shown in FIG. 4 are assigned identical reference symbols to omit further explanation. In the present embodiment, instead of the current source 112 and the resistors 109 and 110 in the aforementioned embodiment, current sources 601 and 602 and a resistor 603 are provided in a differential circuit 604. According to the present embodiment, it becomes possible to adopt smaller values as the voltage of the control voltage source 113.

In the above embodiemnts, one of the transistors 102 and 104 may be omitted by employing a transistor having an emitter area twice as large as each of the transistors 102 and 104.

Although particular embodiments of the present invention have been shown and described, it will be obvious to those skilled in the art that the present invention may be changed and modified without departing from the spirit and scope of the present invention.

What is claimed is:

1. A detector comprising a first transistor receiving a bias voltage at its base, a second transistor receiving a true signal of an input signal along with said bias voltage at its base, a third transistor receiving a complementary signal of said input signal along with said bias voltage at its base, a first current source connected in common to emitters of siad first, second and third transistors, a fourth and a fifth transistor having bases between which a control voltage is supplied, a second current source, means for supplying a current of said second current source to said fourth and fifth transistors, a first load connected in common to collectors of said first and fourth transistors, a second load connected in common to collectors of said second, third, and fifth transistors, a first output terminal derived from said first load, and a second output terminal derived from said second load.

2. The detector as claimed in claim 1, wherein each of said first and said second current sources includes a transistor biased by a band gap voltage.

3. The detector as claimed in claim 2, wherein said supplying means comprises a first resistor connecting the emitter of said fourth transistor to said second current source and a second resistor connecting the emitter of said fifth transistor to said second current source.

4. The detector as claimed in claim 2, wherein said supplying means comprises a resistor connecting the emitters of said fourth and fifth transistors to each other and said second current source has first and second current output nodes connected to the emitters of said fourth and fifth transistors, respectively.

5. A detector comprising first, second and third transistors connected to form a first differential circuit, means for supplying said first transistor with a bias voltage, means for supplying said second transistor with a first signal along with said bias voltage, means for supplying said third transistor with a second signal having a phase opposite to the phase of said first signal along with said bias voltage, fourth and fifth transistors conencted to form a second differential circuit, means for applying a control voltage between said fourth and fifth transistors, a first load connected in common to said first and fourth transistors to produce a first output signal, and a second load connected in common to said second, third and fifth transistors to produce a second output signal.

6. The detector as claimed in claim 5, further comprising a first current source for supplying a first operating current to said first differential circuit and a second current source for supplying a second operating current to said second differential circuit, each of said first and second operating current having temperature dependence.

7. In an automatic gain control amplifier circuit comprising an amplifier circuit for amplifying an input signal, and a detection circuit for generating a gain control voltage in response to an amplitude of an output signal from the amplifier circuit, the detector circuit comprising a first transistor receiving a bias voltage at its base, a second transistor receiving a true signal of an input signal along with said bias voltage at its base, a third transistor receiving a complementary signal of said input signal along with said bias voltage at its base, a first current source connected in common to emitters of said first, second and third transistors, a fourth and a fifth transistor having bases between which a control voltage is supplied, a second current source, means for supplying a current of said second current source to said fourth and fifth transistors, a first load conencted in common to collectors of said first and fourth transistors, a second load connected in common to collectors of said second, third, and fifth transistors, a first output terminal derived from said first load, and a second output terminal derived from said second load, whereby temperature dependence of the amplitude of the output signal from the amplifier circuit is at least substantially reduced.

8. The circuit as claimed in claim 7, wherein each of said first and said second current sources includes a transistor biased by a band gap voltage.

9. The circuit as claimed in claim 8, wherein said supplying means comprises a first resistor connecting the emitter of said fourth transistor to said second current source and a second resistor connecting the emitter of said fifth transistor to said second current source.

10. The circuit as claimed in claim 8, wherein said supplying means comprises a resistor connecting the emitters of said fourth and fifth transistors to each other and said second current source has first and second current output nodes connected to the emitters of said fourth and fifth transistors, respectively.

11. In an automatic gain control amplifier circuit comprising an amplifier circuit for amplifying an input signal, and a detector circuit for generating a gain control voltage in response to an amplitude of an output signal of the amplifier circuit, the detector circuit comprising:

first, second and third transistors connected to form a first differential circuit;

means for supplying said first transistor with a bias voltage;

means for supplying said second transistor with a first signal along with said bias voltage;

means for supplying said third transistor with a second signal having a phase opposite to a phase of said first signal along with said bias voltage;

fourth and fifth transistors connected to form a second differential circuit;

means for applying a control voltage between said fourth and fifth transistors;

a first load connected in common to said first and fourth transistors to produce a first output signal; and a second load connected in common to said second, third and fifth transistors to produce a second output signal.

12. The circuit as claimed in claim 11, and further comprising a first current source for supplying a first operating current to said first differential circuit, and a second current source for supplying a second operating current to said second differential circuit, each of said first and second operating current having temperature dependence.

* * * * *